(12) United States Patent
Rudholm et al.

(10) Patent No.: US 6,965,238 B2
(45) Date of Patent: Nov. 15, 2005

(54) METHODS AND APPARATUS FOR ANALYZING HIGH VOLTAGE CIRCUIT BREAKERS

(75) Inventors: Stig Olov Rudholm, Ranas (SE); Nils Fredrik Wacklen, Akersberga (SE)

(73) Assignee: General Electric Company, Schenectady, NY (US)

( * ) Notice: Subject to any disclaimer, the term of this patent is extended or adjusted under 35 U.S.C. 154(b) by 37 days.

(21) Appl. No.: 10/403,335

(22) Filed: Mar. 31, 2003

(65) Prior Publication Data

US 2004/0189307 A1   Sep. 30, 2004

(51) Int. Cl.[7] .................. G01R 31/327; G01R 13/14
(52) U.S. Cl. ............... 324/421; 324/424; 324/76.15; 324/525
(58) Field of Search ................ 324/415–424, 324/525, 76.15; 361/115, 116, 435, 634

(56) References Cited

U.S. PATENT DOCUMENTS

| | | | |
|---|---|---|---|
| 4,157,496 A * | 6/1979 | St-Jean ..................... 324/415 |
| 4,324,959 A | 4/1982 | Hall et al. |
| 5,119,260 A * | 6/1992 | Huhse et al. .................. 361/2 |
| 5,270,658 A * | 12/1993 | Epstein ..................... 324/424 |
| 5,388,021 A * | 2/1995 | Stahl ......................... 361/56 |
| 5,629,864 A * | 5/1997 | Noe et al. ................. 702/115 |
| 5,859,596 A * | 1/1999 | McRae ................. 340/870.02 |
| 5,982,593 A * | 11/1999 | Kimblin et al. ............... 361/42 |
| 6,191,589 B1 * | 2/2001 | Clunn ........................ 324/424 |
| 6,295,272 B1 | 9/2001 | Feldman et al. |
| 6,392,395 B2 * | 5/2002 | Roberts et al. ............... 324/66 |
| 6,421,167 B1 | 7/2002 | Cohen et al. |
| 6,466,023 B2 * | 10/2002 | Dougherty et al. ......... 324/424 |
| 6,472,877 B1 * | 10/2002 | Sands ......................... 324/423 |
| 6,618,649 B1 * | 9/2003 | Shilo ......................... 700/292 |
| 6,744,260 B2 * | 6/2004 | Schmalz et al. ............ 324/555 |
| 2002/0196030 A1 * | 12/2002 | Kamitana ................... 324/523 |

* cited by examiner

Primary Examiner—Anjan Deb
Assistant Examiner—Jeff Natalini
(74) Attorney, Agent, or Firm—Armstrong Teasdale LLP

(57) ABSTRACT

Methods, computer program segment and apparatus for analyzing high voltage circuit breakers are provided. The method includes determining a circuit breaker contact closing time, determining a circuit breaker contact opening time, and determining a circuit breaker pre-insertion resistor resistance value using at least three voltage samples and three current samples to facilitate reducing an induced current measurement error. The computer program segment is embodied on a computer readable media and is programmed to determine a circuit breaker contact closing time, determine a circuit breaker contact opening time, and determine a circuit breaker pre-insertion resistor resistance value using at least three voltage samples and three current samples that facilitate minimizing an induced current measurement error. The apparatus includes a testing circuit, an overvoltage protection circuit, and a processor programmed to determine a circuit breaker contact timing measurement and a circuit breaker contact resistance measurement.

31 Claims, 5 Drawing Sheets

_US 6,965,238 B2_

METHODS AND APPARATUS FOR ANALYZING HIGH VOLTAGE CIRCUIT BREAKERS

BACKGROUND OF THE INVENTION

This invention relates generally to high voltage circuit breakers, and more specifically to methods and systems for analyzing circuit breaker contacts.

At least some known circuit breakers, use a pre-insertion resistor to facilitate protecting circuits during closing operations of the circuit breaker. Specifically, as the circuit breaker is closed, the pre-insertion resistor is connected in parallel with a gap defined between the open circuit breaker contacts. More specifically, when the pre-insertion resistor is placed in parallel with the gap, the circuit voltage measured to ground (generally line-to-ground voltage) is dropped across the resistor. Accordingly, the current flowing through the resistor is determined by V/Z, wherein V represents the line-to-ground voltage of the circuit and Z represents the vector sum of the resistance of the pre-insertion resistor and the surge impedance of inductive and capacitive elements, such as capacitor banks, reactors, and bus work coupled to and within the circuit. The current determined by this calculation is often referred to as the inrush current and may momentarily achieve a substantially high level when the circuit breaker is used in conjunction with a capacitor bank.

During operation, inrush currents with relatively large magnitudes may cause damage to the circuit. For example, without pre-insertion resistors, the inrush current may reach values of about 10 to 30 thousand amperes. However, with a pre-insertion resistor installed, the initial inrush current may reach values of only about 2 to 4 thousand amperes. Following the initial inrush current, the current through the pre-insertion resistor may be limited by the steady state impedance of capacitor banks, and other circuit components, such as, but not limited to loads, reactors, and bus work coupled to the circuit. Consequently, following the initial inrush current, the current flow through the pre-insertion resistor is generally within the range of 100 to 400 amperes. Additionally, after the initial inrush current has subsided, and the current through the pre-insertion resistor has been reduced dropped to a substantially lower level of 100–400 amperes. If the circuit breaker is switching capacitor banks, the banks discharge directly through the contacts, such that the current is limited by the surge impedance of the banks and the bus work.

The engagement of the main contacts shunts the majority of the circuit breaker current through the main contacts so that the pre-insertion resistor does not carry a substantial part of the continuous or normal current through the circuit breaker. Therefore, the timing of the closure of circuit breaker contacts and the resistive integrity of the pre-insertion resistor are factors that may facilitate enhanced operation of a high voltage circuit breaker. Accordingly, verifying such parameters by periodic testing may facilitate proper circuit breaker operation. However, such testing is typically performed in place, for example, in a switchyard or substation where the circuit breaker is normally located, and may subject testing equipment to power line frequency interference from voltages induced into test equipment components and/or cabling from power lines located proximate the circuit breaker and testing equipment. Additionally, when timing a circuit breaker in a substation with high voltage lines surrounding the circuit breaker being tested, a power line frequency current flow may be undesirably induced into the measurement circuits due to capacitive coupling between the test object and adjacent high voltage lines. The interference current may be of substantially the same frequency as the desired measurement result, therefore adversely affecting the measurement result.

BRIEF DESCRIPTION OF THE INVENTION

In one aspect, a method for measuring a resistance of an electrical contact pair in the presence of a low frequency electromagnetic interference is provided. The contact pair includes at least one movable contact, the movable contact is movable to break electrical contact with the other contact during an open operation, and the movable contact is movable to make electrical contact with the other contact during a close operation. The method includes injecting a high frequency signal across a contact pair in an open state, measuring a voltage across the contact pair, measuring a current flowing through the contact pair, and calculating a resistance of the contact pair using the measured voltage and the measured current.

In another aspect, a computer program embodied on a computer readable media for analyzing circuit breakers is provided. The program includes a software code segment programmed to determine a circuit breaker contact closing time, determine a circuit breaker contact opening time, and determine a circuit breaker pre-insertion resistor resistance value using three voltage samples and three current samples that facilitate minimizing an induced current measurement error.

In yet another aspect, a test device for analyzing circuit breakers is provided. The test device includes a testing circuit electrically coupled to at least one output terminal, an overvoltage protection circuit electrically coupled between the at least one output terminal and electrical ground, and a processor programmed to determine a circuit breaker contact timing measurement and a circuit breaker contact resistance measurement using a square wave test signal.

DETAILED DESCRIPTION OF THE INVENTION

Periodic testing of circuit breakers may include performing a contact timing test and a pre-insertion resistor resistance test. The timing test measures an elapsed time from the initiation of movement of circuit breaker contacts until the main circuit current stops flowing during an opening test, and also an elapsed time from an initiation of movement of the contacts until the main circuit current starts flowing during a closing test. The pre-insertion resistor resistance test measures the value of the pre-insertion resistor.

Figure 1:
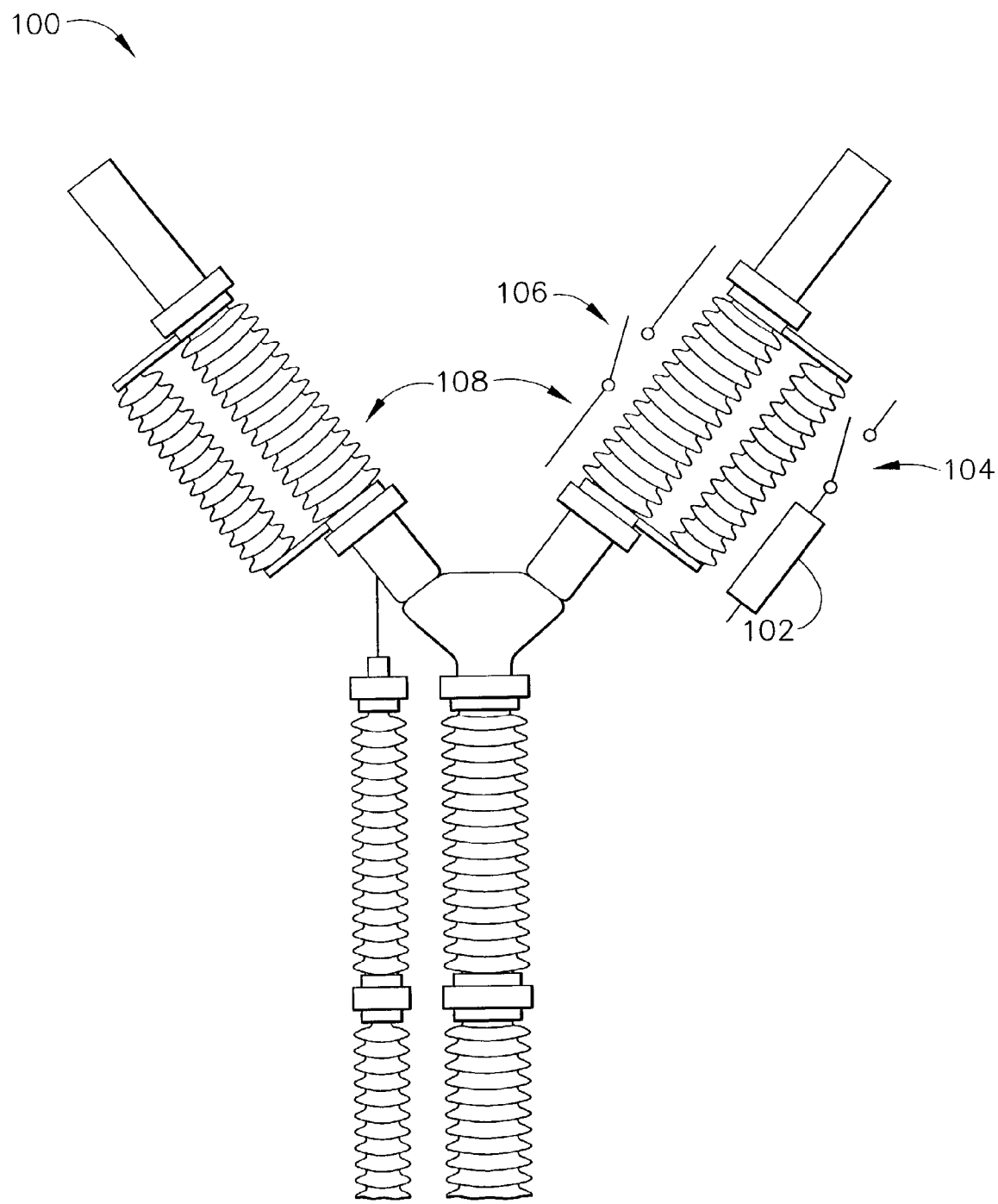
FIG. 1 is a schematic illustration of an exemplary high voltage circuit breaker phase.

FIG. 1 is a schematic illustration of an exemplary high voltage circuit breaker phase 100. A high voltage circuit breaker (not shown) may include a pre-insertion resistor 102 and a moving resistor contact 104 electrically coupled in parallel with a moving main contact 106. In the exemplary embodiment, phase 100 includes two breaks 108 that each include a pre-insertion resistor (only one is shown in FIG. 1).

In operation, when the circuit breaker receives a command to close from an open position, linkages within the circuit breaker cause movable portions of contacts 104 and 106 to shift towards engaging respective non-movable portions of contacts 104 and 106. During a testing sequence, movement of the movable portion of contacts 104 and 106 may initiate a timer. After a predetermined distance of travel of the movable portions of contacts 104 and 106 has lapsed, the movable portion of pre-insertion resistor contact 104 engages the non-movable portion of contact 104, causing current to flow through contact 104 and pre-insertion resistor 102. A current surge through contact 104 may be limited by pre-insertion resistor 102. After a predetermined time delay, the movable portion of contact 106 engages the non-movable portion of main contact 106. Since the resistance of main contact 106 may be substantially less than the resistance of pre-insertion resistor 102, substantially all current flowing through the circuit breaker flows through main contact 106. During testing, the resistance values of contacts 104 and 106 may be determined, in addition to the resistance value of pre-insertion resistor 102 and the timing of circuit breaker contacts 104 and 106. More specifically, the resistances are measured dynamically and the value of pre-insertion resistor 102 is measured in a time period elapsed between the closing of resistor contact 104 and the closing of main contact 106. Based on the measured resistance values, known threshold values are used to determine when main contact 106 and resistor contact 104 are each considered to be open and/or closed, such that the contact timing may be calculated. In one embodiment no pre-insertion resistor 102 is included in the circuit breaker, and only the timing of main contact is determined.

Figure 2:
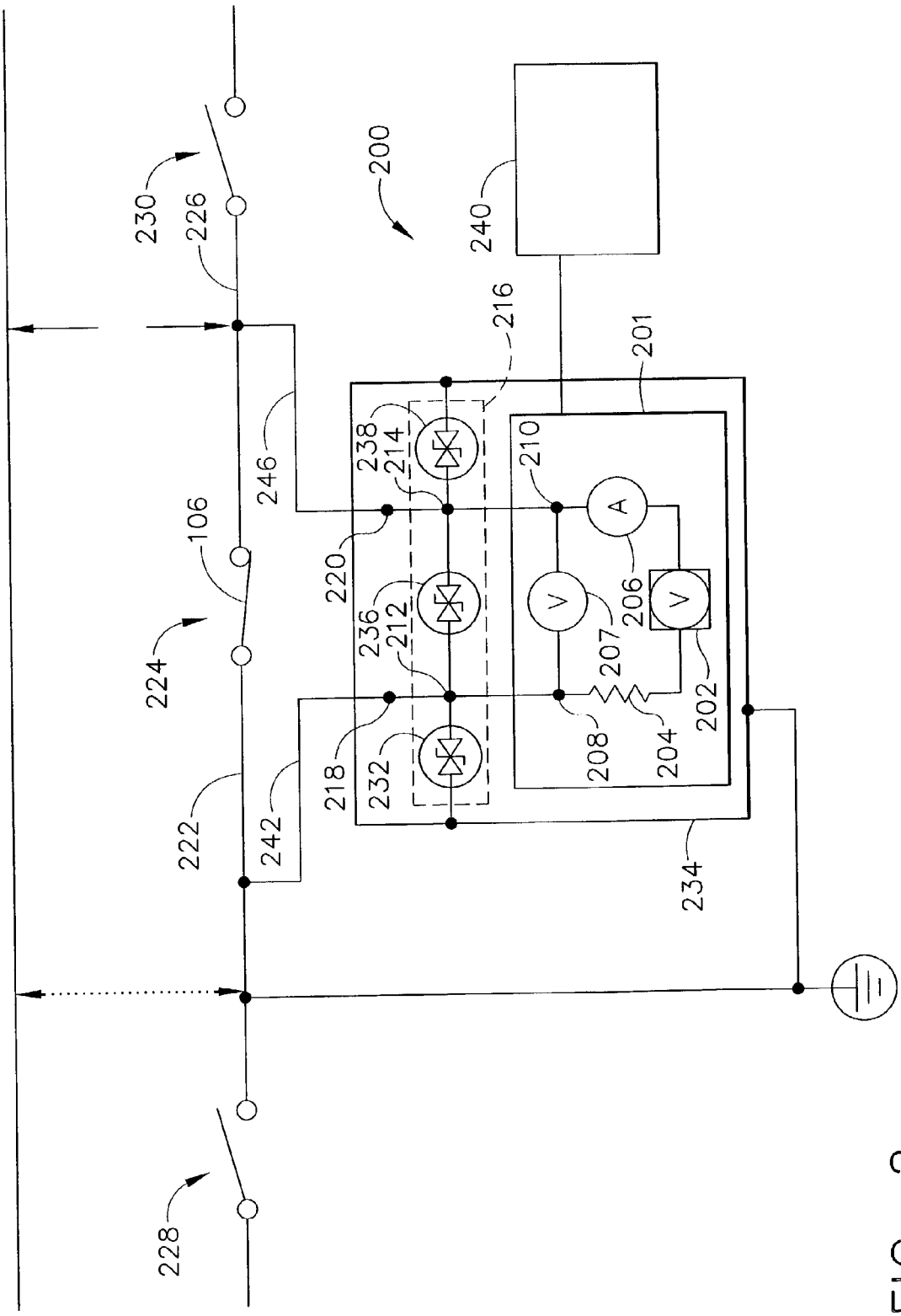
FIG. 2 is a schematic illustration of an exemplary circuit breaker testing device that may be used to test the circuit breaker phase shown in FIG. 1.

FIG. 2 is a schematic illustration of an exemplary circuit breaker testing device 200 that may be used to test circuit breaker phase 100 (shown in FIG. 1). Testing devise 200 includes a testing circuit 201 that includes a four-quadrant voltage source 202 for supplying measurement signals to the object being tested. In the exemplary embodiment, only a single phase of a substation circuit breaker is illustrated. A current limiting resistor 204 and an ammeter 206 are electrically coupled in series with voltage source 202. A voltmeter 207 is electrically coupled in parallel to the series combination of resistor 204, source 202, and ammeter 206 at a first node 208 and a second node 210. Nodes 208 and 210 are electrically coupled to nodes 212 and 214, respectively, in an over-voltage protection circuit 216. Nodes 212 and 214 are also electrically coupled to output terminals 218 and 220, respectively. Over-voltage protection circuit 216 includes a first transient voltage surge suppressor (TVSS) that is electrically coupled to a grounded case 234 of testing device 200 and node 212. A second TVSS 236 is electrically coupled between nodes 212 and 214, and a third TVSS 238 is electrically coupled between node 214 and grounded case 234. Terminal 218 is electrically coupled to a line side 222 of one phase of circuit breaker 224, and terminal 220 is electrically coupled to a load side 226 of circuit breaker 224. Disconnect switches 228 and 230 are electrically coupled to line side 222 and load side 224 of circuit breaker 224, respectively, to isolate circuit breaker 224 from other components during testing and/or maintenance activities.

A microprocessor 240 is communicatively coupled to testing circuit 201 for controlling voltage source 202, ammeter 206, voltmeter 207 and the operation of circuit breaker 224 during testing. Microprocessor 240 may also receive signals from ammeter 206, voltmeter 207 and components (not shown) of circuit breaker 224 for monitoring circuit breaker 224 operation, initiating testing sequences, and collecting, storing, and manipulating data to facilitate determining a circuit breaker 224 timing, and contact and resistor resistances. The term microprocessor, as used herein, refers to microprocessors, microcontrollers, reduced instruction set circuits (RISC), application specific integrated circuits (ASIC), logic circuits, and any other circuit or processor capable of executing the functions described herein. In the exemplary embodiment, microprocessor 240 executes instructions stored in software. In another embodiment, microprocessor 240 executes instructions stored in firmware (not shown). In yet another embodiment, microprocessor 240 is a circuit defined to perform the functions described herein. Additionally, although the herein described methods and apparatus are described in an industrial setting, it is contemplated that the benefits of the invention accrue to non-industrial systems such as those systems typically employed in a commercial setting, such as, for example, but not limited to, electronics and communications.

Testing device 200 is illustrated testing one phase of a high voltage circuit breaker. With additional inputs and software timers, testing device 200 is capable of testing all phases of a circuit breaker simultaneously, as well as testing all phases of multiple circuit breakers simultaneously.

In operation, terminal 218 may be electrically coupled to line side 222 via cable 242 and terminal 220 may be coupled to load side 226 via cable 246. Processor 240 initiates a testing sequence upon a user's command. In the exemplary embodiment, processor 240 directs testing device 100 through a diagnostic routine that verifies operation of components internal to testing device 100 and also verifies proper connection of test leads 242 and 246. Source 202 generates a voltage signal that is transmitted through ammeter 206 to load side 226 through main contact 106 of circuit breaker 224 to line side connection 222 before being returned to voltage source 202. In the exemplary embodiment, voltage source 202 transmits a ten kilohertz square wave signal that varies between approximately ten volts and fifty-five volts. Microprocessor 240 may control operation of voltage source 202 to other parameters depending on the requirements of a specific test being run. During testing, a current may be induced into testing circuit 201 from high voltage power lines adjacent breaker 224. The current may be induced into circuit 201 at a power line frequency, such as, for example sixty Hertz or fifty Hertz. Such an induced signal may interfere with an accurate measurement of resistance and timing if the induced signal is not suppressed, eliminated, and/or accounted for in the measurement sequence.

Figure 3:
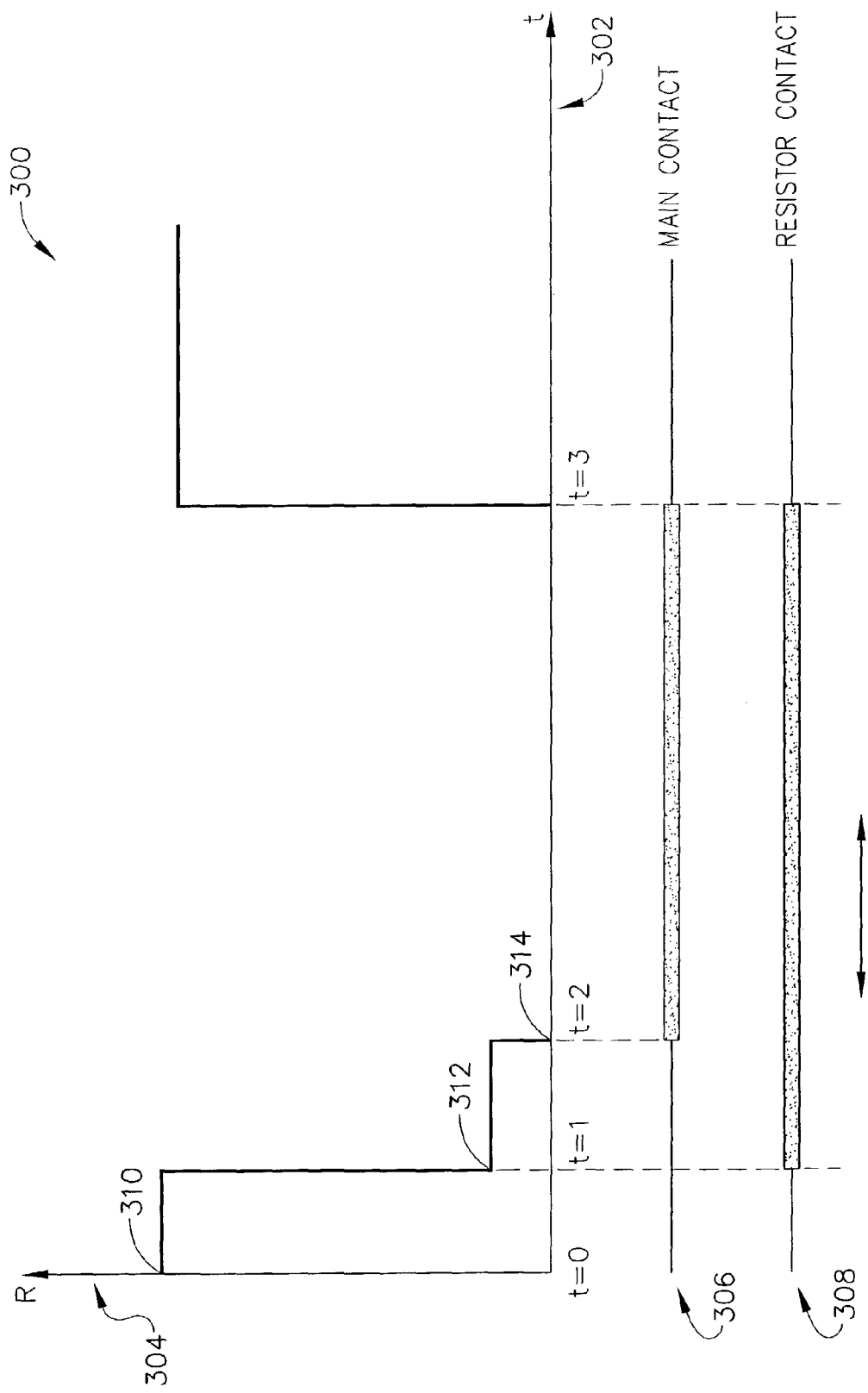
FIG. 3 is a graph illustrating an exemplary trace of contact resistance plotted against time as measured by the testing device shown in FIG. 2.

FIG. 3 is a graph 300 illustrating an exemplary trace of contact resistance plotted versus time as measured by testing device 200 (shown in FIG. 2). Graph 300 includes an x-axis 302 that represents time (t) from the initiation of a testing sequence at t=0. A y-axis 304 represents a magnitude of resistance (R) measured between terminals 218 and 220 of testing device 200. A first legend 306 illustrates when main contact 106 is in a closed state and a second legend 308 indicates when resistor contact 104 is in a closed state. A heavy black line on each legend 306 and 304 represents the contacts in the closed state.

During testing, circuit breaker 224 may start in the open state at t=0 wherein a resistance 310 of contacts 104 and 106 is relatively large, and wherein substantially zero current flows through contacts 104 and 106. While monitoring circuit voltage and current, and while calculating contact resistance, processor 240 commands circuit breaker 224 to close, thereby initiating a timing sequence to facilitate determining a time it takes for each contact to close. When resistor contact 104 closes at time t=1, trace 304 illustrates a contact resistance 312 that is approximately equal to a resistance of pre-insertion resistor 102, for example, approximately one hundred ohms. At time t=2, main contact 106 closes and trace 304 illustrates a contact resistance 314 that is relatively low, for example, on the order of several milli-ohms or less. After time t=2 but before time t=3 the contact 104 open. The opening of contact 104 can not be monitored using the method described here since contact 104 in series with pre-insertion resistor 102 are paralleled by the very low resistance contact 106.

Processor 240 may calculate contact operating time based on measured resistance of contacts 104 and 106 and the command to the breaker to close. Similarly, operation of circuit breaker 224, during an open operation may also be monitored. As illustrated at time t=3, contact 106 opens when commanded by processor 240 to open. An elapsed time between the initiation of the open command and time t=3 represents a circuit breaker 224 actuation time in the open sequence.

Figure 4:
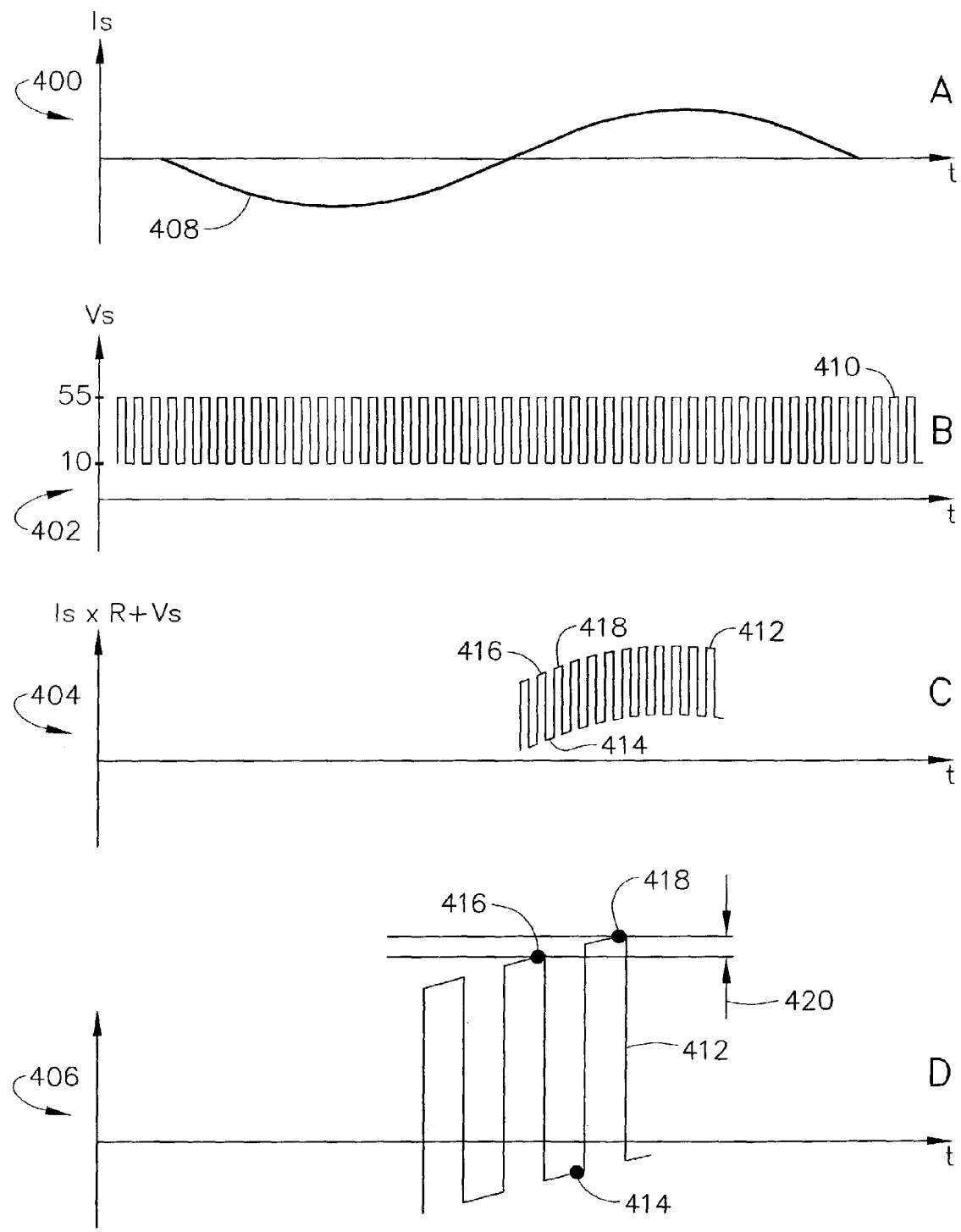
FIG. 4 are a series of graphs that illustrate exemplary current and voltage signals used in measuring contact resistance and circuit breaker timing by the testing device shown in FIG. 2.

FIG. 4 are a series of graphs 400, 402, 404, and 406 that illustrate exemplary current and voltage signals used to measure contact resistance and circuit breaker timing by testing device 200 (shown in FIG. 2). Graph 400 illustrates a trace 408 of current that may be induced into the circuitry of testing device 200 based on a location proximate high voltage power lines in a switchyard or a substation, for example, where the testing may be taking place. Trace 408 illustrates one cycle of power line frequency. Trace 408 also illustrates the voltage across the pre-insertion resistor caused by the induced current. The magnitude of the trace is illustrated qualitatively.

In the exemplary embodiment, graph 402 illustrates a trace 410 of the output of voltage source 202 (shown in FIG. 2) in the exemplary embodiment, as a ten kilohertz square wave that varies between ten volts and fifty-five volts. Trace 410 also illustrates the current through the pre-insertion resistor caused by the generated voltage. In other embodiments, voltage source 202 may utilize a signal at a different frequency and/or different voltage magnitudes.

Graph 404 illustrates a trace 412 that is a sum of traces 408 and 410 that shows both the voltage and the current traces that are a result of the voltage produced by the induced current flowing through the contact resistance modulating the square wave output of voltage source 202. A point 414 represents a measurement point during testing at a local minimum value of trace 412. Point 416 represents a measurement point at a local maximum value of trace 412 occurring prior to point 414 in time, and point 418 represents a measurement point at a local maximum value of trace 412 occurring subsequent to point 414 in time. The sum of the voltage caused by the induced current passing through the resistance in circuit breaker 224 and the resistance in the measurement circuit and the generated square wave voltage is measured by voltmeter 207 in testing circuit 201.

Graph 406 illustrates an enlarged portion of trace 412. A magnitude difference 420 represents a difference between the magnitude of trace 412 at point 418 and at point 416. Difference 420 may be an offset in the voltage/current received during testing by testing device 200 that is attributable to the current induced into the testing device circuitry from the high voltage power lines. Processor 240 may modify a result of testing by difference 420 to facilitate determining a more accurate value of contact resistance, pre-insertion resistor resistance, and circuit breaker timing.

If there is substantially zero induced current, the quotient between the voltage and the current, measured by voltmeter 207 and ammeter 206, may represent the resistance across terminals 218 and 220 of testing device 200, and the contacts of circuit breaker 224. When the induced current is not substantially zero, the circuit includes two unknown variables: the induced current and the circuit breaker contact resistance. To determine the circuit breaker contact resistance in the presence of the induced current, two equations are used to determine the two circuit unknowns. Voltage and current samples from points 414 and 416 are used to populate an equation for the circuit breaker contact resistance at a first level of induced current and voltage and current samples from points 414 and 418 are used to populate an equation for the circuit breaker contact resistance at a second level of induced current. Three samples are populated such that there are two equations with two unknown variables: the induced current and the circuit breaker contact resistance. From the equation system, the induced current is eliminated and the circuit breaker contact resistance is solved for.

Figure 5:
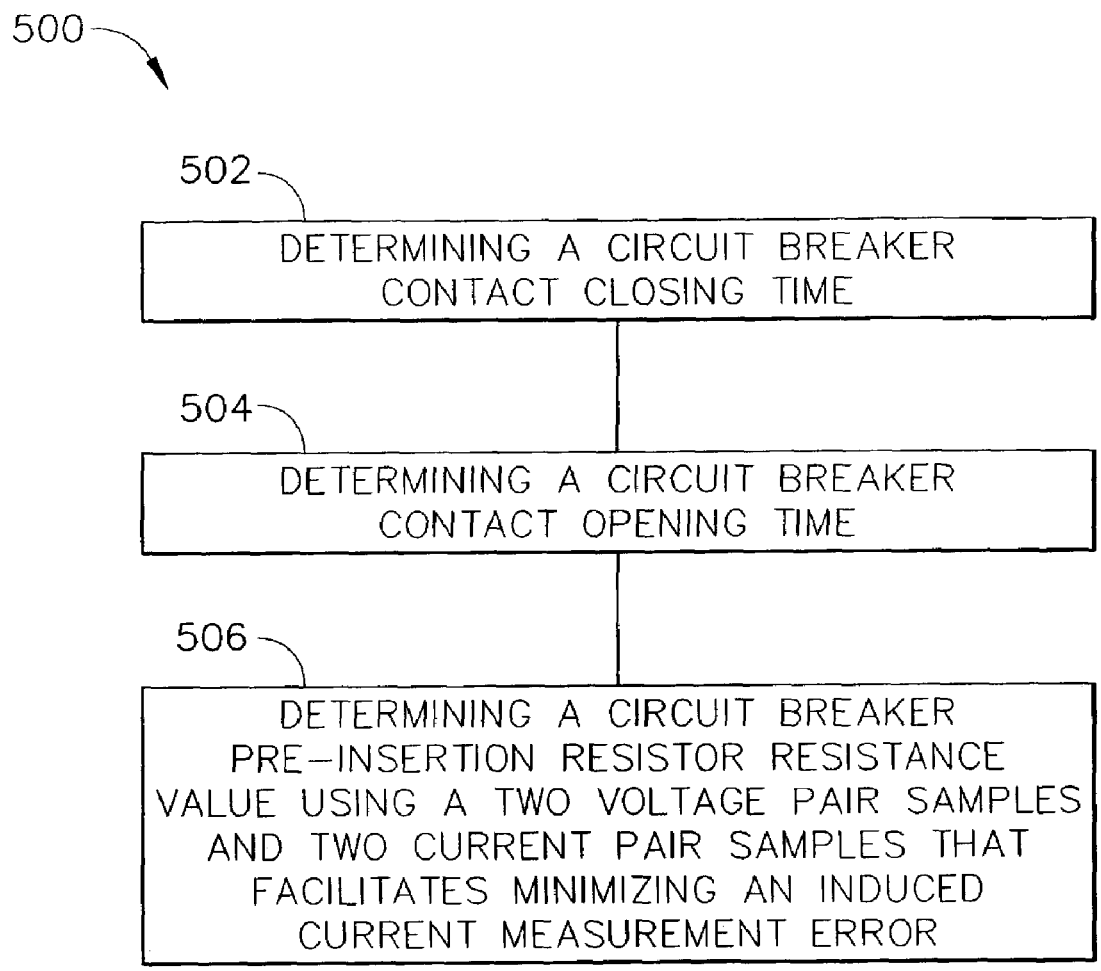
FIG. 5 is a flow diagram illustrating an exemplary method of measuring the timing of a circuit breaker while suppressing induced current measurement errors.

The resulting resistance is then given by the following formula:

$$R_n = (V_N - (V_{N-1} + V_{N+1})/2)/(I_N - (I_{N-1} + I_{N+1})/2);$$

where:

$R_n$ is the resistance of at least one of the pre-insertion resistor and the circuit breaker contacts;

$V_N$ is a local minimum magnitude of the injected and induced voltage signal;

$V_{N-1}$ is a local maximum magnitude of the injected and induced voltage signal preceding the local minimum;

$V_{N+1}$ is a local maximum magnitude of the injected and induced voltage signal succeeding the local minimum;

$I_N$ is a local minimum magnitude of the injected and induced current signal;

$I_{N-1}$ is a local maximum magnitude of the injected and induced current signal preceding the local minimum; and $I_{N+1}$ is a local maximum magnitude of the injected and induced current signal succeeding the local minimum;

FIG. 5 is a flow diagram illustrating an exemplary method 500 for measuring the timing of a circuit breaker while suppressing induced current measurement errors. Method 500 includes determining 502 a circuit breaker contact closing time from a testing sequence circuit breaker operation command and a circuit breaker measurement that indicates the breaker has actuated. The testing device processor initiates a circuit breaker operation command, such as, for example, a circuit breaker close command. Initiation of the circuit breaker operation also initiates a timer. The time elapses until a measured circuit breaker parameter indicates that the circuit breaker has closed. In the exemplary embodiment, a voltage across the circuit breaker contacts, and a current through the contacts are measured to enable a contact resistance to be calculated. If the calculated contact resistance is within a predefined threshold value, the calculation indicates the circuit breaker contacts are closed and the timer is stopped. In the exemplary embodiment, a first timer is used to measure the closing time of a circuit breaker pre-insertion resistor contact and a second timer is used to measure the closing time of the circuit breaker main contact. In an alternative embodiment, wherein a pre-insertion resistor is not used, only one timer is used to monitor the main contact closing time. In another alternative embodiment, additional timers are used to monitor other circuit breaker parameters.

Similarly to determining the circuit breaker closing time, a circuit breaker contact opening time is determined 504. The processor initiates an opening command to the circuit breaker, which also starts a timer. The time elapses from the opening command until circuit breaker parameters indicate the circuit breaker contacts are open. During testing, the circuit breaker pre-insertion resistor resistance value and main contact resistance value may be determined 506 using three voltage samples and three current samples. Such a method facilitates minimizing an induced current measurement error due to currents induced into testing device cabling and circuits, and the circuit breaker components due to their location in close proximity to high voltage power lines in.

While the present invention is described with reference to measuring timing and resistance of contacts of a high voltage circuit breaker, numerous other applications are contemplated. For example, it is contemplated that the present invention may be applied to any system wherein electromagnetic interference may induce low frequency currents into measured parameters and measuring devices such that the accuracy of such measurements is reduced without suppression of the induced currents.

The above-described high voltage circuit breaker testing system is cost-effective and highly reliable for determining a circuit breaker contact timing and resistance in the presence of induced currents from electromagnetic interference. More specifically, the methods and systems described herein facilitate determining circuit breaker operating times and contact resistances accurately in the presence of electromagnetic induced currents in the circuit breaker circuit and testing circuit. In addition, the above-described methods and systems facilitate providing an accurate and repeatable circuit breaker timing and contact resistance measurement with minimal operator interaction. As a result, the methods and systems described herein facilitate maintaining high voltage circuit breakers in a cost-effective and reliable manner.

Exemplary embodiments of circuit breaker testing systems are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. A method for measuring a resistance of an electrical contact pair in the presence of a low frequency electromagnetic interference wherein the contact pair includes at least one movable contact, the movable contact is movable to break electrical contact with the other contact during an open operation, and the movable contact is movable to make electrical contact with the other contact during a close operation, said method comprising:

injecting a high frequency signal across a contact pair in an open state;

measuring a voltage across the contact pair;

measuring a current flowing through the contact pair; and calculating a resistance of the contact pair using a measured voltage and a measured current sampled at a first time, a measured voltage and a measured current sampled at a second time, and a measured voltage and a measured current sampled at a third time to facilitate minimizing induced current measurement error wherein the first, second, and third times are spaced approximately one half period of the high frequency signal apart.

2. A method in accordance with claim 1 further comprising:

changing the state of the contact pair from the open state to a closed state;

measuring a voltage across the contact pair during the change of state;

measuring a current flowing through the contact pair during the change of state; and calculating a resistance of the contact pair during the change of state using the measured voltage and the measured current.

3. A method in accordance with claim 1 wherein injecting a high frequency signal comprises a square wave.

4. A method in accordance with claim 1 wherein measuring comprises sampling the voltage across the contact pair and the current flowing through the contact pair at least a local minimum value, a first local maximum value occurring just prior to the local minimum in time, and a second local maximum occurring just subsequent to the local minimum in time.

5. A method in accordance with claim 1 wherein calculating a resistance of the contact pair comprises calculating a resistance of the contact pair using the formula:

$$R_n = (V_N - (V_{N-1} + V_{N+1})/2)/(I_N - (I_{N-1} + I_{N+1})/2);$$

where;

$R_n$ is the resistance of the contact pair;

$V_N$ is a local minimum magnitude of the injected and induced voltage signal;

$V_{N-1}$ is a local maximum magnitude of the injected and induced voltage signal preceding the local minimum;

$V_{N+1}$ is a local maximum magnitude of the injected and induced voltage signal succeeding the local minimum;

$I_N$ is a local minimum magnitude of the injected and induced current signal;

$I_{N-1}$ is a local maximum magnitude of the injected and induced current signal preceding the local minimum; and $I_{N+1}$ is a local maximum magnitude of the injected and induced current signal succeeding the local minimum.

6. A method for analyzing the operation of circuit breakers, said method comprising:

injecting a voltage signal across a circuit breaker contact pair during a testing sequence; and determining at least one of a circuit breaker pre-insertion resistor resistance value and a contact pair resistance using at least three voltage samples and three corresponding current samples to facilitate reducing an induced current measurement error wherein the samples are spaced apart approximately one half period of the voltage signal.

7. A method in accordance with claim 6 further comprising:

electrically coupling a voltage source to a circuit breaker line side connection; and electrically coupling the voltage source to a circuit breaker load side connection.

8. A method in accordance with claim 6 further comprising:

measuring a voltage signal across the circuit breaker contact pair; and measuring a current through the circuit breaker contact pair.

9. A method in accordance with claim 8 wherein measuring a voltage signal across the circuit breaker contacts comprises measuring a voltage signal that includes an injected portion and an induced portion.

10. A method in accordance with claim 8 further comprising determining the resistance of the circuit breaker contact pair using the formula:

$$R_n=(V_N-(V_{N-1}+V_{N+1})/2)/(I_N-(I_{N-1}+I_{N+1})/2);$$

where;

$R_n$ is the resistance of at least one of the pre-insertion resistor and the circuit breaker contact pair;

$V_N$ is a local minimum magnitude of the injected and induced voltage signal;

$V_{N-1}$ is a local maximum magnitude of the injected and induced voltage signal preceding the local minimum;

$V_{N+1}$ is a local maximum magnitude of the injected and induced voltage signal succeeding the local minimum;

$I_N$ is a local minimum magnitude of the injected and induced current signal;

$I_{N-1}$ is a local maximum magnitude of the injected and induced current signal preceding the local minimum; and $I_{N+1}$ is a local maximum magnitude of the injected and induced current signal succeeding the local minimum.

11. A method in accordance with claim 6 wherein injecting a voltage signal comprises injecting a square wave voltage signal.

12. A method in accordance with claim 11 wherein injecting a square wave voltage signal comprises injecting a square wave voltage signal wherein the voltage signal varies from about ten volts to about fifty-five volts.

13. A method in accordance with claim 11 wherein injecting a square wave voltage signal comprises injecting a square wave voltage signal at a voltage signal frequency of about ten kilohertz.

14. A method in accordance with claim 6 further comprising:

determining a circuit breaker contact closing time; and determining a circuit breaker contact opening time.

15. A computer program embodied on a computer readable media for analyzing circuit breakers comprising a software code segment programmed to:

inject a voltage signal across a circuit breaker contact pair during a testing sequence; and determine a circuit breaker pre-insertion resistor resistance value using three voltage samples and three corresponding current samples to facilitate reducing an induced current measurement error wherein the samples are spaced apart approximately one half period of the voltage signal.

16. A software code segment in accordance with claim 15 programmed to:

inject a voltage signal across the circuit breaker contacts;

measure a voltage magnitude across the circuit breaker contacts; and measure a current through the circuit breaker contacts.

17. A software code segment in accordance with claim 16 further programmed to inject a square wave voltage signal.

18. A software code segment in accordance with claim 17 programmed to inject a square wave voltage signal that varies from about ten volts to about fifty-five volts.

19. A software code segment in accordance with claim 17 programmed to inject a square wave voltage signal that comprises a frequency of about ten kilohertz.

20. A software code segment in accordance with claim 15 programmed to measure a voltage magnitude across the circuit breaker contacts that includes an injected portion and an induced portion.

21. A software code segment in accordance with claim 15 further programmed to determine the resistance of the circuit breaker contacts using:

$$R_n=(V_N-(V_{N-1}+V_{N+1})/2)/(I_N-(I_{N-1}+I_{N+1})/2);$$

where;

$R_n$ is the resistance of at least one of the pre-insertion resistor and the circuit breaker contacts;

$V_N$ is a local minimum magnitude of the injected and induced voltage signal;

$V_{N-1}$ is a local maximum magnitude of the injected and induced voltage signal preceding the local minimum;

$V_{N+1}$ is a local maximum magnitude of the injected and induced voltage signal succeeding the local minimum;

$I_N$ is a local minimum magnitude of the injected and induced current signal;

$I_{N-1}$ is a local maximum magnitude of the injected and induced current signal preceding the local minimum; and $I_{N+1}$ is a local maximum magnitude of the injected and induced current signal succeeding the local minimum.

22. A software code segment in accordance with claim 15 further programmed to:

determine a circuit breaker contact closing time; and determine a circuit breaker contact opening time.

23. A circuit breaker test device for analyzing the operation of circuit breakers comprising:

a testing circuit electrically coupled to at least one output terminal; and a processor communicatively coupled to said testing circuit, said processor programmed to determine at least one of a circuit breaker contact timing measurement and a circuit breaker contact resistance measurement using a square wave test signal injected across the circuit breaker contact and measuring plurality of voltage values sampled across the circuit breaker contact and corresponding current samples to calculate said circuit breaker contact resistance to facilitate minimizing induced current measurement error wherein the samples are spaced apart approximately one half period of the voltage signal.

24. A circuit breaker test device in accordance with claim 23 wherein an overvoltage protection circuit is electrically coupled between the at least one output terminal and electrical ground.

25. A circuit breaker test device in accordance with claim 23 wherein said processor is further programmed to determine at least one of a main contact timing measurement and a pre-insertion resistor contact timing measurement.

26. A circuit breaker test device in accordance with claim 23 wherein said processor is further programmed to determine at least one of a circuit breaker main contact resistance and a circuit breaker pre-insertion resistor resistance.

27. A circuit breaker test device in accordance with claim 23 wherein said testing circuit comprises:

a four quadrant voltage source;

a current limiting resistor electrically coupled in series with the voltage source;

an ammeter electrically coupled in series with the voltage source; and a voltmeter electrically coupled in parallel with the series combination of said voltage source, said current limiting resistor, and said ammeter.

28. A circuit breaker test device in accordance with claim 23 further comprising a grounded case wherein said circuit breaker test device comprises two output terminals and wherein said overvoltage protection circuit comprises a first transient voltage surge suppressor electrically coupled between a first output terminal and said circuit breaker test device case, a second transient voltage surge suppressor electrically coupled between said two output terminals, and a third transient voltage surge suppressor electrically coupled between said second output terminal and said circuit breaker test device case.

29. A circuit breaker test device in accordance with claim 28 wherein at least one of said transient voltage surge suppressor is a bi-directional transient voltage surge suppressor.

30. A circuit breaker test device in accordance with claim 23 further comprising a processor communicatively coupled to at least one of said voltage source, said voltmeter, and said ammeter, said processor configured to receive electrical signals from said voltage source, said voltmeter, and said ammeter for monitoring the electrical signals and for transmitting a measurement output.

31. A circuit breaker test device in accordance with claim 30 wherein said processor is programmed to determine the resistance of the circuit breaker contacts using:

$$R_n = (V_N - (V_{N-1} + V_{N+1})/2)/(I_N - (I_{N-1} + I_{N+1})/2);$$

where;

$R_n$ is the resistance of at least one of the pre-insertion resistor and the circuit breaker contacts;

$V_N$ is a local minimum magnitude of the injected and induced voltage signal;

$V_{N-1}$ is a local maximum magnitude of the injected and induced voltage signal preceding the local minimum;

$V_{N+1}$ is a local maximum magnitude of the injected and induced voltage signal succeeding the local minimum;

$I_N$ is a local minimum magnitude of the injected and induced current signal;

$I_{N-1}$ is a local maximum magnitude of the injected and induced current signal preceding the local minimum; and $I_{N+1}$ is a local maximum magnitude of the injected and induced current signal succeeding the local minimum.

* * * * *